TRANSISTOR SWEEP GENERATOR
Filed Feb. 27, 1956
Fig. I.
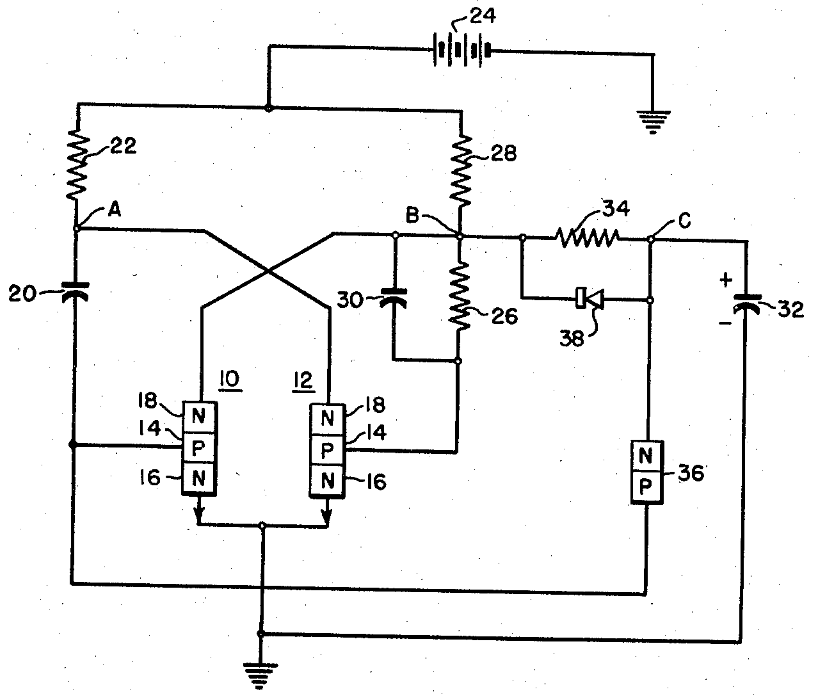
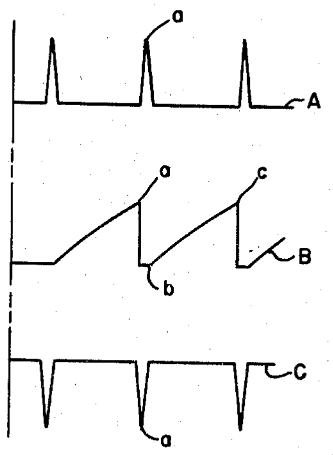
Fig. 2.
WITNESSES:
Bernard R. Giegue
T. H. Murray
INVENTORS
Henri H. Hoge and
Douglas L. Spotten
BY F. E. Browder
ATTORNEY United States Patent Office 2,841,712
Patented July 1, 1958

2,841,712

TRANSISTOR SWEEP GENERATOR

Henri H. Hoge and Douglas L. Spotten, Baltimore, Md., assignors to Westinghouse Electric Corporation, East Pittsburgh, Pa., a corporation of Pennsylvania Application February 27, 1956, Serial No. 567,887

7 Claims. (Cl. 250—36)

This invention relates to a sweep generator employing transistors as switches, and more particularly to a transistor sweep generator which is controlled by a Zener-type diode.

It is a primary object of this invention to provide a new and improved sweep generator.

More specifically, it is an object of the invention to provide a transistor sweep generator which is triggered by the Zener current flowing through a silicon junction diode. As will become apparent from the following detailed description, the invention employs, as a basic component, a mono-stable transistor flip-flop circuit. A capacitor is connected in parallel with the normally conducting transistor of the flip-flop circuit, and the voltage applied across this transistor is sufficient to cause it to saturate. By employing a Zener-type diode to apply the voltage developed across this capacitor when the normally conducting transistor saturates between the emitter and base of the normally non-conducting transistor, the flip-flop circuit will switch from one state to the other, resulting in a saw-tooth wave form appearing across the capacitor.

A still further object of the invention is to provide a transistor sweep generator which is simple and rugged in construction.

The above and other objects and features of the invention will become apparent from the following detailed description taken in connection with the accompanying drawings which form a part of this specification and in which:

Figure 1 is a schematic circuit diagram of one embodiment of the invention; and

Fig. 2 illustrates voltage wave forms appearing at various points in the circuit of Fig. 1.

Referring to Fig. 1 the circuit shown includes two NPN junction transistors 10 and 12. In accordance with well-known transistor theory, an NPN junction transistor consists of a bar of single-crystal n-type germanium in which a thin layer has been converted to p-type germanium. Non-rectifying contacts are fastened to the three germanium regions, the one attached to the layer of p-type germanium being called the base 14. One of the junctions between the p-type and n-type germanium regions is called the emitter 16, and the other junction is called the collector 18. The junctions between the p-type and n-type germanium act as rectifiers. Very little current flows when the n-type regions are positive relative to the p-type region, whereas a relatively large electron current flows when the n-type regions are negative relative to the p-type base by as little as a fraction of a volt. If the emitter 16 is biased negatively by a few tenths of a volt, an appreciably large number of electrons flow from the n-type emitter region 16 into the p-type base layer 14 where they diffuse toward the collector 18. Because of the combination of electrons with holes in the base layer, the injected electrons have a finite lifetime in the base layer. If the thickness of this base layer is small, however, the emitter-collector transit time is small enough so that a large portion of the electrons reach the collector junction where they are pulled across the barrier by the field and added to the small initial collector current. In a transistor of this type the emitter-to-collector current will increase as the voltage across these elements increases until a saturation point is reached. At this point the current through the transistor remains constant as the voltage increases.

The emitters of transistors 10 and 12 are connected to ground potential, substantially as shown. Base 14 of transistor 10 is connected through capacitor 20 and resistor 22 to the positive terminal of a source of direct current voltage, such as battery 24. In a similar manner base 14 of transistor 12 is connected through resistors 26 and 28 to the positive terminal of voltage source 24. Collector 18 of transistor 10 is connected to the base of transistor 12 through capacitor 30 which is connected in shunt with resistor 26, and collector 18 of transistor 12 is connected to the junction of capacitor 20 and resistor 22.

In parallel with the emitter and base of transistor 12 and resistor 26 are a capacitor 32 and resistor 34, connected in series. Resistor 34 is of a relatively large magnitude with respect to resistors 22, 26 and 28. A Zener-type diode 36 has its anode connected to the base 14 of transistor 10 and its cathode connected to the junction of capacitor 32 and resistor 34. The reverse current voltage characteristic of a Zener diode of this type is such that as the reverse voltage is increased from zero, the current increases very slowly until the Zener voltage is reached. At this point the diode, in effect, breaks down, and the current through the diode increases very rapidly, becoming substantially independent of voltage. Diode 38, in shunt with resistor 34, completes the circuit.

In operation, when the source of direct current voltage 24 is applied to the circuit, emitter 16 of transistor 12 will be at a slight negative potential with respect to its base 14. Consequently, transistor 12 will conduct, and current will flow through resistor 22 and the collector and emitter of transistor 12 until the transistor saturates. The resulting current flowing through resistor 22 lowers the potential at point A. Under these conditions transistor 12 will continue to conduct, while transistor 10 will be cut off. When saturation occurs in transistor 12, capacitor 32 charges with the polarity shown in the drawing. After the voltage across the capacitor 32 reaches a predetermined magnitude, the Zener diode 36 will break down and will apply a positive bias to the base of transistor 10, this action resulting in conduction being initiated in transistor 10. Transistor 10 will then saturate, and its collector current will lower the potential at point B. Capacitor 30 acts to couple this lowered potential to the base of transistor 12, thereby cutting it off and causing the potential at point A to rise. Capacitor 20 couples this rise in voltage to the base of transistor 10 to hold this transistor in saturation long enough to allow capacitor 32 to discharge through diode 38 and transistor 10. The cycle is completed when the currents through capacitors 20 and 30 decay, allowing transistor 10 to return to a cut-off condition and the current through resistor 26 to initiate conduction in transistor 12.

In Fig. 2 the wave forms appearing at points A, B and C in the circuit of Fig. 1 are shown. At time (*a*) the Zener diode 36 breaks down and allows capacitor 32 to discharge. Consequently, the voltages at points C and B drop sharply, and the voltage at point A rises sharply since transistor 12 is now cut off. Starting at time (*a*), capacitors 20 and 30 discharge until time (*b*) is reached, at which time transistor 12 again conducts. Saturation in transistor 12 is reached almost immediately; and, therefore, capacitor 32 charges and causes a rise in voltage at point C until time (c) is reached, when the cycle is repeated.

The circuit thus produces a saw-tooth wave form at point C. This wave form may obviously be controlled by varying the breakdown voltage of the Zener diode 36. In one embodiment of the invention that has been found to work satisfactorily, the following circuit constants were used:

| | | |
|---|---|---|
| Resistors **22** and **28** | ohms | 36,000 |
| Resistor **26** | do | 220,000 |
| Resistor **34** | megohm | 1.5 |
| Capacitor **20** | microfarads | .05 |
| Capacitor **30** | do | .01 |
| Capacitor **32** | do | .2 |

Although the invention has been described in connection with a certain specific embodiment, it will be readily apparent to those skilled in the art that various changes in form and in arrangement of parts may be made to suit requirements without departing from the spirit and scope of the invention.

We claim as our invention:

1. A sweep generator comprising first and second transistors each having an emitter, a collector and a base, a source of driving potential for said transistors having its negative terminal connected to a point of reference potential, means connecting the emitters of said transistors to said point of reference potential, means connecting the collectors of said transistors to the positive terminal of said source of driving potential, a capacitor connected between the base of said first transistor and the collector of said second transistor, a capacitor and a resistor connected in parallel between the base of said second transistor and the collector of said first transistor, circuit means including a capacitor and an impedance element connected in series between the emitter and collector of said first transistor, and a Zener-type diode connected between the base of said first transistor and the junction of said serially-connected capacitor and impedance element.

2. The combination claimed in claim 1 wherein the first and second transistors are of the NPN junction type.

3. In a sweep generator, first and second transistors each having an emitter, a collector and a base, means interconnecting said emitters, a capacitor connected between the base of said first transistor and the collector of said second transistor, a capacitor connected between the base of said second transistor and the collector of said first transistor, circuit means including a capacitor in series with a resistor coupling said interconnected emitters to the collector of said first transistor, and a Zener-type diode connected between the base of said first transistor and the junction of said serially-connected capacitor and resistor.

4. A sweep generator comprising first and second transistors each having an emitter, a collector and a base, means for coupling said transistors together whereby conduction in one transistor will cut off the other and vice versa, a capacitor in series with a resistor coupling the emitters of both of said transistors to the collector of one of said transistors, and a Zener-type diode connecting the base of said one transistor to the junction of said serially-connected capacitor and resistor.

5. A sweep generator comprising first and second transistors each having an emitter, a collector and a base, means for coupling said transistors together whereby conduction in one transistor will cut off the other and vice versa, electrical energy storing means coupling the emitters of both of the transistors to the collector of one of said transistors, and a device for applying the voltage developed across said energy storing means between the base and emitter of said one transistor when the said voltage across the energy storing means reaches a predetermined magnitude.

6. A sweep generator comprising first and second transistors each having an emitter, a collector and a base electrode, means interconnecting the electrodes of said transistors whereby conduction in one transistor will cut off the other and vice versa, means for causing current flow in one of said transistors, an electrical energy storing device connected in parallel with said one transistor, said storing device being charged when said one transistor becomes saturated, and a device for applying the voltage developed across said energy storing device between the emitter and base of the other of said transistors when the said voltage across the energy storing device reaches a predetermined magnitude.

7. In a sweep generator, first and second transistors each having an emitter, a collector and a base, means interconnecting the emitters of said transistors, circuit means including a capacitor coupling the interconnected emitters to the collector of one of said transistors, and a Zener-type diode connecting one side of said capacitor to the base of the other of said transistor.

References Cited in the file of this patent

UNITED STATES PATENTS

| | | |
|---|---|---|
| 2,655,608 | Valdes | Oct. 13, 1953 |
| 2,655,609 | Shockley | Oct. 13, 1953 |
| 2,737,587 | Trousdale | Mar. 6, 1956 |